United States Patent [19]

Sharma et al.

[11] Patent Number: 5,894,038

[45] Date of Patent: Apr. 13, 1999

[54] DIRECT DEPOSITION OF PALLADIUM

[75] Inventors: Sunity Kumar Sharma, Palo Alto; Kuldip Kumar Bhasin, Mountain View; Subhash C. Narang, Palo Alto; Asutosh Nigam, Fremont, all of Calif.

[73] Assignee: The Whitaker Corporation, Wilmington, Del.

[21] Appl. No.: 08/808,302

[22] Filed: Feb. 28, 1997

[51] Int. Cl.$^6$ .............................. B05D 3/00; B05D 3/02
[52] U.S. Cl. .................... 427/554; 427/556; 427/581; 427/229
[58] Field of Search ................... 427/554, 555, 427/556, 557, 581, 229

[56] References Cited

U.S. PATENT DOCUMENTS

| | | | |
|---|---|---|---|
| 4,042,392 | 8/1977 | Gysling et al. | 427/504 |
| 4,046,569 | 9/1977 | Gysling et al. | 427/266 |
| 4,152,155 | 5/1979 | Lelental et al. | 96/48 PA |
| 4,176,085 | 11/1979 | Yoo et al. | 525/428 |
| 4,715,935 | 12/1987 | Lovie et al. | 204/44.6 |
| 4,933,204 | 6/1990 | Warren, Jr. et al. | |
| 5,021,398 | 6/1991 | Sharma et al. | 505/1 |
| 5,179,060 | 1/1993 | Subramanian et al. | 502/332 |
| 5,281,447 | 1/1994 | Brady et al. | 427/555 |

FOREIGN PATENT DOCUMENTS 39 22 233 A1  1/1991  Germany .............. C23C 16/48

OTHER PUBLICATIONS

International Search Report, Applicant's reference 16904 PCT, International application No. PCT/US 98/03598, International filing date, Feb. 24, 1998.
Database WPI, Section Ch, Week 9706, Derwent Publications Ltd., London GB; Class L03, 97–467697, XP002071625 Lapter et al, "Laser assisted N deposition onto synthetic diamond" →Symposium, France May 4–7, 1993 and vol. 241, No. 1–2 ISSN 0040–6090, Then Solid films, Apr. 1, 1994, pp. 76–79, Switzerland–Abstract.
Gozum, et al., J. Am. Chem. Soc. vol. 110, pp. 2688–2689, no month 1988, "Tailored Organometallics as Precursors for the Chemical Vapor Deposition of High–Purity Palladium and Platinum Thin Films."
Longenberger and Mills, J. Phys. Chem., vol. 99, pp. 475–478, 1995, "Formation of Metal Particles in Aqueous Solutions by Reactions of Metal Complexes with Polymers." Jan.
Baum and Jones, J. Vac. Sci. Tech. B, vol. 4, pp. 1187–1191, 1986, "Laser chemical vapor deposition of gold: part II." Sep./Oct.
Baum, J. Electrochem. Soc., vol. 134, pp. 2616–2619, 1987, "Laser Chemical Vapor Deposition of Gold." Oct.

Ye and Hunsperger, Appl. Phys. Lett., vol. 51, pp. 2136–2138, 1987, "Ultraviolet–light–induced deposition of gold films." Dec.
Gross, et al., J. Appl. Phys., vol. 60, pp. 529–533, 1986, "A chemical and mechanistic view of reaction profiles in laser direct–write metallization in metal–organic films. Gold." Jul.
Berry, et al., Sensors and Actuators A, vol. 51, pp. 47–50, 1995, "The production of fine metal tracks from a new range of organometallic compounds." No Month.
Baum, Jones, Appl. Phys. Lett., vol. 47, pp. 538–540, 1985 "Laser chemical vapor deposition of gold." Sep.
Baum and Marinero, Appl. Phys. Lett., vol. 49, pp. 1213–1215, 1986, "Projection printing of gold micropatterns by photochemical decomposition." Nov.
Davidson, et al., Chem. Mater., vol. 6, No. 10, 1994, pp. 1712–1725, "Laser Photochemical Deposition of Gold from Trialkylphosphine Alkylgold(I) Complexes." no month.
Berry, et al., J. Mat. Sci. Lett., vol. 14, pp. 844–846, 1995, "New material for the production of fine line interconnects in integrated circuit technology." No month.
Nakoa, and Sone, Chem. Commun., 1996, pp. 897–898. "Reversible dissolution/deposition of gold in iodine–iodide––acetonitrile systems." no month.
Nakao, J. Chem. Soc., Chem., Commun., 1992, pp. 426–427, "Dissolution of Noble Metal in Halogen–Halide––Polar Organic Solvent Systems." no month.

*Primary Examiner*—Marianne Padgett
*Attorney, Agent, or Firm*—Mary K. VanAtten

[57] ABSTRACT

The present invention is directed to a process for forming a layer of palladium on a substrate, comprising:

preparing a solution of a palladium precursor, wherein the palladium precursor consists of

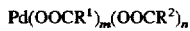

$Pd(OOCR^1)_m(OOCR^2)_n$ wherein $R^1$ is hydrogen, alkyl, alkenyl, alkynyl, —$R^3$COOH, alkyl from 1 to 5 carbons substituted with one or two hydroxyl groups, $R^2$ is hydrogen, alkyl, alkenyl, alkynyl, —$R^3$COOH, alkyl from 1 to 5 carbon atoms substituted with one or two hydroxyl groups, —CHO, $R^3$ is alkyl, and alkyl groups from 1 to 5 carbon atoms substituted with one or two hydroxyl groups m and n are real numbers or fractions, and m+n=2;

applying the palladium precursor to the surface of the substrate;

decomposing the palladium precursor by subjecting the precursor to heat.

16 Claims, No Drawings

DIRECT DEPOSITION OF PALLADIUM

FIELD OF THE INVENTION

The invention is directed to a process for directly depositing a layer of palladium on a substrate.

BACKGROUND OF THE INVENTION

Palladium films act as excellent barrier layers for preventing migration of other metals in a substrate, such as an electrical contact, to the surface of the contact where oxidation of the other metal could take place. Palladium films are often made on a substrate by electroplating, vacuum sputtering, and laser direct-write metallization. Palladium is difficult to electroplate due to embrittlement on account of hydrogen induced cracking as the palladium is deposited. Palladium can also be deposited using electroless methods. Despite problems associated with electroplating and electroless methods, these processes are still used. Palladium films are best made by vacuum techniques such as chemical vapor deposition (CVD), metal-organic chemical vapor deposition (MOCVD), or sputtering.

In Gozum, et al. (Gozum, John E.; Pollina, Deborah M.; Jensen, James A.; Girolami, Gregory S. J. Am. Chem. Soc. 1988, 110, 2688), the chemical vapor deposition of a palladium layer is reported using bis(allyl)palladium, bis(2-methylallyl)palladium, and (cyclopentadienyl)(allyl) palladium as the starting precursor. The chemical vapor deposition of these precursors was accomplished at 250° C. at $10^{-4}$ Torr. Palladium films were grown on substrates such as glass, steel, copper, and aluminum.

Gold can be deposited onto a substrate by decomposing a gold precursor. For example, in U.S. Pat. No. 4,933,204, a method is shown for depositing gold features on a substrate. Gold(III) hydroxide is dissolved in acetic acid to form gold(III) acetate. Gold features were then formed by casting the gold(III) acetate film on a suitable substrate such as silicon, and then traversing the film with a laser in the locations where it is desired to produce the conducting lines. The laser was operated at a power and speed sufficient to heat the traversed locations to a temperature above about 175° C. The gold(III) acetate was decomposed under the heat from the laser to release a layer of gold on the surface of the substrate and release the acetate.

What is needed is a milder method for depositing a layer of palladium on a substrate. What is further needed is a method which does not require the use of a vacuum for deposition, electroplating or electroless methods.

SUMMARY OF THE INVENTION

In one aspect, the present invention relates to a process for forming a layer of palladium on a substrate, comprising:

preparing a solution of a palladium precursor, wherein the palladium precursor consists of $$Pd(OOCR^1)_m(OOCR^2)_n$$

wherein $R^1$ is hydrogen, alkyl, alkenyl, alkynyl, —$R^3$COOH, alkyl from 1 to 5 carbons substituted with one or two hydroxyl groups, $R^2$ is hydrogen, alkyl, alkenyl, alkynyl, —$R^3$COOH, alkyl from 1 to 5 carbon atoms substituted with one or two hydroxyl groups, —CHO, $R^3$ is alkyl, and alkyl groups from 1 to 5 carbon atoms substituted with one or two hydroxyl groups m and n are real numbers or fractions, and m+n=2;

applying the palladium precursor to the surface of the substrate;

decomposing the palladium precursor by subjecting the precursor to heat.

It is an object of the present invention to provide a non vacuum technique, non electroplating, and a non electroless method for depositing a palladium film on a substrate.

It is a further object to provide a mild method for depositing a palladium film on electrical interconnects, flex circuits, multi-chip modules, and printed wiring boards.

It is a further object to provide an environmentally benign process releasing only benign compounds such as water and carbon dioxide into the environment.

DETAILED DESCRIPTION OF THE INVENTION

As used herein:

"alkyl" refers to alkyl groups having from 1 to 10 carbon atoms, unless otherwise specified;

"alkenyl" refers to organic groups having 1 to 10 carbon atoms and at least one double bond, the unsaturation can be at any location;

"alkynyl" refers to organic groups having 1 to 10 carbon atoms and at least one triple bond.

It has been discovered that palladium(II) carboxylates, and in some cases, mixed palladium(II) carboxylates can be used as precursors to form a palladium film or layer on a substrate under very mild conditions. The palladium precursors that the film is prepared from have the formula:

$$Pd(OOCR^1)_m(OOCR^2)_n$$

where:

$R^1$ is hydrogen, alkyl, alkenyl, alkynyl, —$R^3$COOH, alkyl from 1 to 5 carbons substituted with one or two hydroxyl groups, $R^2$ is hydrogen, alkyl, alkenyl, alkynyl, —$R^3$COOH, alkyl from 1 to 5 carbon atoms substituted with one or two hydroxyl groups, —CHO, $R^3$ is alkyl, and alkyl groups from 1 to 5 carbon atoms substituted with one or two hydroxyl groups m and n are real numbers or fractions, and m+n=2.

More preferably, $R^2$ is hydrogen, alkyl of from 2 to 10 carbon atoms, alkenyl, alkynyl, —$R^3$COOH, alkyl from 1 to 5 carbon atoms substituted with one or two hydroxyl groups, and —CHO.

A few examples of the palladium precursors are:

$Pd(OOCCH_3)_m(OOCCH(C_2H_5)CH_2CH_2CH_2CH_3)_n$
$Pd(OOCCH_3)_m(OOCH)_n$
$Pd(OOCCH(C_2H_5)CH_2CH_2CH_2CH_3)_2$
$Pd(OOCH)_{1.5}(OOCCH(C_2H_5)CH_2CH_2CH_2CH_3)_{0.5}$
$Pd(OOCH)(OOCCH(C_2H_5)CH_2CH_2CH_2CH_3)$
$Pd(OOCCH(OH)CH(OH)COOH)_m(OOCCH(C_2H_5)CH_2CH_2CH_2CH_3)_n$
$Pd(OOCCH(OH)CH(OH)COOH)_2$
$Pd(OOCCHCH_2)_2$
$Pd(OOCCH_3)_m(OOCCHCH_2)_n$
$Pd(OOCCHCH_2)_m(OOCCH_2OH)_n$
$Pd(C_2O_4)$

All of these compounds are capable of affording palladium films upon pyrolysis in air. These are mostly compounds with a mixed functionality and hence these afford good green films. These compounds are highly solvated in solution. Furthermore, upon pyrolysis, the compounds decompose to give environmentally benign byproducts.

The palladium precursors are formed in situ, within the solution which is to be applied to the substrate. Therefore, the exact ratio of the substituents is not determined. The compounds can be used directly without isolating and determining the ratio of the substituents. It is only important that the amount of palladium which is present in the solution is known.

The compounds have been prepared by mild solvolysis of palladium(II) acetate with the acids of the substituting anions in a polar solvent, such as ethyl acetate. Examples of methods to form metallo carboxylates are shown in U.S. Pat. No. 5,021,398, which is herein incorporated by reference. The palladium precursors are readily soluble in polar solvents such as methanol and DMSO (dimethylsulfoxide). The palladium precursors can be applied directly to the surface of the substrate in these solvents for the formation of the palladium film. The choice of the particular palladium precursor to be used is dependent upon the substrate on which the palladium will be deposited.

The substrate onto which the palladium precursor can be deposited, and subsequently a palladium layer formed, can be a metallic material. Also, the substrate can be plastic, ceramic, glass, silicon wafer, cellulose, graphite, and paper substrates. Specific applications of this process can be used for placing a palladium layer on electrical contacts, multi-chip modules, printed wiring boards, and PCMCIA (Personal Computer Memory Card International Association) cards. This process presents an alternative to not only electroplating, but also to vacuum deposition techniques.

From the potential palladium precursors, the appropriate one may be chosen depending on the substrate to be used. For example, for the deposition of palladium on paper glyoxilic palladium glycoliate $(Pd(OOCCHO)_p(OOCCH_2OH)_q)$ may be a better choice than others. This particular palladium compound will decompose slowly at 80° C., and very rapidly at 100° C. Therefore, this compound is suited for depositing palladium on paper because it decomposes at a low temperature. The thermal stability of the substrate is the governing factor in this consideration. For example, thermal analysis of palladium diglycolate shows that the compound decomposes at approximately 125° C. A good thermal analysis scan of glyoxilic palladium glycoliate could not be obtained because it was thermally unstable.

The palladium precursors can be applied to the substrate using a variety of different application techniques. The choice of a particular technique depends on the end use and mode of production. The precursor can be applied using any one, or a combination, of the following techniques: ink-jet printing, screem printing, spray coating, spin coating, puddle coating, dip coating, brush coating, or various other coating techniques.

Surface pretreatment of the substrate is not absolutely necessary before applying the precursor, however, the palladium film adhesion to the substrate may be better if the surface is first activated by removal of grit, dust, grease and other contaminates, prior to application of the precursor solution.

In order to improve the film forming properties of the solution, a small amount of a non-ionic surfactant may be added to the solution of the palladium precursor. For example, TRITON X 100 (a nonionic detergent octoxynol-9 commercially available from Fluka Chemie AG) can be added to the solution of the precursor. Only a small amount of surfactant is added to the solution. For example, less than 0.1% by weight of the surfactant would be added to the solution of the palladium precursor. There are many other commercially available surfactants that can be used in the process. During pyrolysis of the palladium precursor, the surfactant will decompose. Alternatively, the surface of the substrate, following pyrolysis, can be washed with an organic solvent to remove any remaining organics or surfactants.

Furthermore, the surface of the substrate to be coated with the palladium precursor can be first treated with the non-ionic surfactant to allow better adhesion of the palladium layer to the substrate. As an alternative method, the surface of the substrate to be coated with the palladium precursor solution may be pretreated with a reducing agent, such as formic acid or vitamin C.

The precursor solution can be converted to a palladium film or layer by heating it to a temperature above about 80° C., and in some cases above 100° C. The exact temperature necessary is dependent upon the precursor. Some precursors will decompose at a lower or higher temperature, depending on the substituents on the palladium. This can be accomplished by exposing the solution, in air, to a hot air gun, a laser, or a heat lamp.

The choice of a particular palladium precursor is dependent upon the substrate to which the palladium layer will be applied and how the substrate will stand up under a particular decomposition temperature. Glyoxilic palladium glycoliate is particularly well suited for application of a palladium layer onto sensitive substrates such as paper or plastic. Other substrates can withstand higher temperatures and therefore a laser could be used to decompose the palladium precursor. The length of time needed to decompose the palladium precursor will be dependent upon the palladium precursor and the power of the laser.

The process herein described could also be used to apply a palladium layer to a specific area of the substrate. To accomplish this, the surface of the substrate would be coated with the palladium precursor. The laser would then be directed toward particular parts of the substrate in order to decompose the palladium precursor on only those parts of the substrate. Once the decomposition of the specific areas of the palladium precursor was completed, the surface of the substrate would then be washed to remove any unreacted palladium precursor leaving a palladium layer in only those areas that were exposed to the laser.

After a first layer of palladium is deposited on the surface of the substrate, it is possible to apply subsequent layers of palladium to the surface by repeating the process. Furthermore, it is possible to apply a thicker coating of the palladium precursor to the substrate in order to deposit a thicker layer of palladium to the substrate in one step.

Examples of methods used to form the palladium carboxylates and a palladium deposit from the film are given below.

EXAMPLE 1
Preparation of glyoxilic palladium(II) glycoliate 1.12 gm of palladium(II) acetate was placed in a flask and 20 ml methanol was added dropwise with stirring at room temperature. 0.38 gm of glycolic acid was added in small portions followed by addition of 0.47 gm of glyoxilic acid monohydrate. The contents were allowed to stir at room temperature for a total of 5 hours. After 1 hour, a clear blood red solution was obtained. The reaction was carried out in an argon atmosphere. The solution thus obtained is filtered through a micro filter to obtain a clear red solution. The filtrate was concentrated under a vacuum to 10 ml.

EXAMPLE 2
Preparation of a palladium layer on nickel coated bronze paddles

The paddles were coated with a solution glyoxilic palladium(II) glycoliate in methanol. The concentration of the solution was such that it had 12% w/w palladium in it. The substrate was allowed to air dry for a short period of time and then irradiated by a $CO_2$ cw laser, 10 watts, to generate the metal film.

Measurements were performed on the palladium layers on the nickel coated bronze paddles. Contact resistance measurements for two separate samples gave 2.56 and 3.29 milliohms respectively (load of 100 g). Typical electroplated palladium has a contact resistance of 1.30 milliohms. The contact resistances of the samples are acceptable in the connector industry, even though they are somewhat higher than for the electroplated palladium. The measured values of coefficient of friction for both samples were in the range of 0.35 to 0.40 and are comparable to that expected for noble metal finishes used on separable contact interfaces. The samples also gave good wear testing after 100 cycles at 100 grams.

The preferred embodiments of this invention have been illustrated by the examples described above. Modifications and additional embodiments, however, will undoubtedly be apparent to those skilled in the art. Furthermore, equivalent elements may be substituted for those illustrated and described herein, and certain features of the invention may be utilized independently of other features. Consequently, the exemplary embodiments should be considered illustrative, rather than inclusive, while the appended claims are more indicative of the full scope of the invention.

What is claimed is:

1. A process for forming a layer of palladium on a substrate, comprising:

preparing a solution of a palladium precursor, wherein the palladium precursor consists of $$Pd(OOCR^1)_m(OOCR^2)_n$$

wherein $R^1$ is selected from the group consisting of hydrogen, alkyl, alkenyl, alkynyl, —$R^3$COOH, alkyl from 1 to 5 carbons substituted with one or two hydroxyl groups;

$R^2$ is selected from the group consisting of hydrogen, alkyl, alkenyl, alkynyl, —$R^3$COOH, alkyl from 1 to 5 carbon atoms substituted with one or two hydroxyl groups, —CHO;

$R^3$ is selected from the group consisting of alkyl, and alkyl groups from 1 to 5 carbon atoms substituted with one or two hydroxyl groups;

wherein $R^1$ is not equal to $R^2$, m and n are real numbers or fractions, and m+n=2, m and n are not equal to 2;

applying the palladium precursor to a surface of the substrate;

decomposing the palladium precursor by subjecting the precursor to heat to form the layer of the palladium.

2. The process of claim 1, wherein the palladium precursor is heated with an air gun.

3. The process of claim 1, wherein the palladium presursor is heated with a laser.

4. The process of claim 1, wherein the composition of the substrate is selected from the group consisting of metal, plastic, glass, paper, silicon, graphite, and cellulose materials.

5. The process of claim 1, wherein a surfactant is added to the solution of the palladium precursor prior to application to the substrate.

6. The process of claim 1, wherein $R^1$ is —OOCCHO and $R^2$ is —OOCCH$_2$OH.

7. The process of claim 6, wherein the precursor is heated to about 80° C. for decomposing the precursor.

8. A process for forming a layer of palladium on a substrate, comprising:

preparing a solution of a palladium precursor, wherein the palladium precursor consist of $$Pd(OOCCHO)(OOCCH_2OH);$$

applying the palladium precursor to the surface of the substrate;

decomposing the palladium precursor by subjecting the precursor to heat to form the layer of the palladium.

9. The process of claim 8, wherein the precursor is heated to about 80° for decomposing the precursor.

10. A process for forming a layer of palladium on a substrate, comprising:

preparing a solution of a palladium precursor, wherein the palladium precursor consists of $$Pd(OOCR^1)_m(OOCR^2)_n$$

wherein $R^1$ is selected from the group consisting of hydrogen, alkyl, alkenyl, alkynyl, —$R^3$COOH, alkyl from 1 to 5 carbons substituted with one or two hydroxyl groups;

$R^2$ is selected from the group consisting of hydrogen, alkyl, alkenyl, alkynyl, —$R^3$COOH, alkyl from 1 to 5 carbon atoms substituted with one or two hydroxyl groups, —CHO;

$R^3$ is selected from the group consisting of alkyl, and alkyl groups from 1 to 5 carbon atoms substituted with one or two hydroxyl groups;

wherein $R^1$ and $R^2$ are not methyl;

m and n are real numbers or fractions, and m+n=2;

the solution of the palladium precursor being prepared in the solution by reacting palladium acetate with a mixture $R^1$OOH and $R^2$OOH;

applying the solution of the palladium precursor to a surface of the substrate;

decomposing the palladium precursor by subjecting the precursor to heat to form the layer of the palladium.

11. The process of claim 10, wherein the palladium precursor is heated with an air gun.

12. The process of claim 10, wherein the palladium precursor is heated with a laser.

13. The process of claim 10, wherein the composition of the substrate is selected from the group consisting of metal, plastic, glass, paper, silicon, graphite, and cellulose materials.

14. The process of claim 10, wherein a surfactant is added to the solution of the palladium precursor prior to application to the substrate.

15. The process of claim 10, wherein $R^1$ is —OOCCHO and $R^2$ is —OOCCH$_2$OH.

16. The process of claim 15, wherein the precursor is heated to about 80° C. for decomposing the precursor.

* * * * *